United States Patent
Jacob et al.

(10) Patent No.: US 6,711,047 B2
(45) Date of Patent: Mar. 23, 2004

(54) TEST CIRCUIT FOR AN ANALOG MEASUREMENT OF BIT LINE SIGNALS OF FERROELECTRIC MEMORY CELLS

(75) Inventors: Michael Jacob, München (DE); Thomas Röhr, Yokohama (JP)

(73) Assignee: Infineon Technologies AG, Munich (DE)

(*) Notice: Subject to any disclaimer, the term of this patent is extended or adjusted under 35 U.S.C. 154(b) by 42 days.

(21) Appl. No.: 10/053,970

(22) Filed: Jan. 22, 2002

(65) Prior Publication Data

US 2002/0097619 A1 Jul. 25, 2002

(30) Foreign Application Priority Data

Jan. 19, 2001 (DE) .......................... 101 02 432

(51) Int. Cl.[7] .............................. G11C 11/22
(52) U.S. Cl. .................. 365/145; 365/117; 365/65; 365/109; 365/171; 365/201
(58) Field of Search ................ 365/145, 117, 365/65, 109, 171, 201

(56) References Cited

U.S. PATENT DOCUMENTS

| | | | | |
|---|---|---|---|---|
| 5,254,482 A | | 10/1993 | Fisch | |
| 6,046,926 A | * | 4/2000 | Tanaka et al. | 365/145 |
| 6,512,686 B2 | * | 1/2003 | Miyamoto | 365/145 |
| 2001/0055229 A1 | * | 12/2001 | Koike | 365/200 |
| 2002/0085406 A1 | * | 7/2002 | McClure | 365/145 |
| 2002/0093847 A1 | * | 7/2002 | Tada | 365/145 |

* cited by examiner

Primary Examiner—Viet Q. Nguyen
(74) Attorney, Agent, or Firm—Laurence A. Greenberg; Werner H. Stemer; Ralph E. Locher

(57) ABSTRACT

A test circuit is integrated in a ferroelectric memory component in order to make analog measurements of bit line signals of ferroelectric memory cells. The test circuit, when in a test mode, reads out analog signal values for the respective memory content of the cells and feds the analog signal values to a downstream evaluation device. The test circuit is integrated as an analog circuit in the ferroelectric memory component and, in the test mode with non-activated or disconnected sense amplifiers, is configured to output analog bit line signals from the memory component to a point outside the memory component.

20 Claims, 1 Drawing Sheet

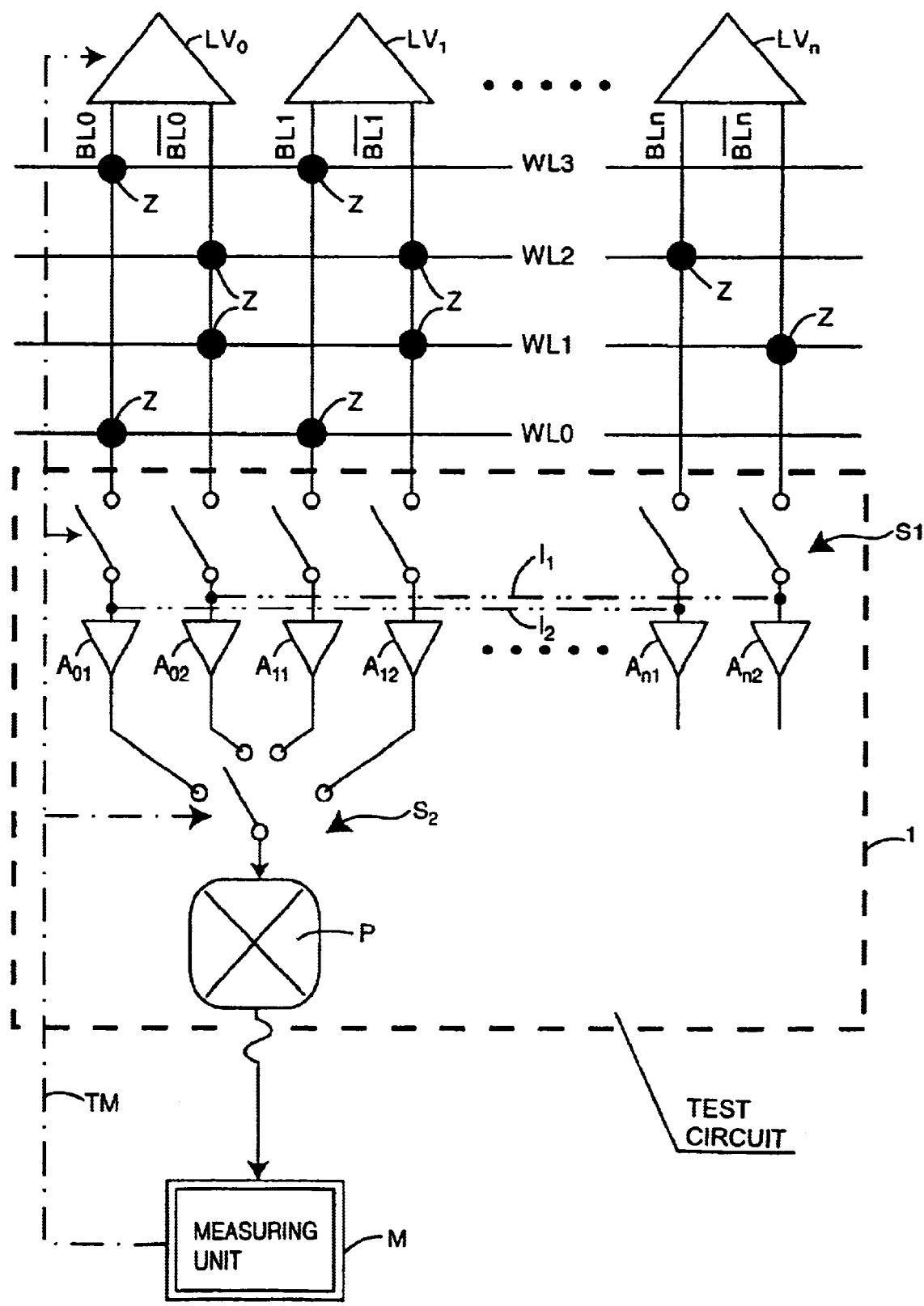

TEST CIRCUIT FOR AN ANALOG MEASUREMENT OF BIT LINE SIGNALS OF FERROELECTRIC MEMORY CELLS

BACKGROUND OF THE INVENTION

1. Field of the Invention

The invention relates to a combination of a test circuit and a ferroelectric memory.

U.S. Pat. No. 5,254,482 discloses a circuit configuration that includes a ferroelectric memory and a test circuit.

Integrated ferroelectric semiconductor memory circuits (Ferro-Electric Random Access Memories, FeRAMs) can be constructed in a manner similar to conventional dynamic memories (Dynamic Random Access Memories, DRAMs), but differ from the latter through the nonvolatility of the memory content and through differently configured aging phenomena. Tests of the nonvolatility (retention) and of the aging (e.g. fatigue, imprint, disturb, . . . ) therefore require new methods in comparison with DRAM tests. Typical DRAM tests include a digital evaluation of the memory content. What is advantageous for the statistical assessment and extrapolation of the decrease in the memory content through stress (for example in the case of electrical or mechanical loading, storage, thermal treatment, irradiation, chemical reactions, . . . ) is, however, an analog evaluation of the memory content through the measurement of analog values of the stored potential. In other words, the analog measurement of bit line signals can already reveal slight stress-induced changes in the potential stored in the cell. This results in substantially more accurate knowledge of the stress influence on the reliability.

In the case of ferroelectric memory components in development, the path taken heretofore has been to use a special test mode to indirectly carry out an analog evaluation of the potential stored in the memory cell. As in the case of a DRAM, a customary sense amplifier was used here to compare the bit line signal to be evaluated with a reference signal on a reference bit line. The potential of the reference signal could be adjusted externally. By progressively altering the externally adjustable reference voltage and comparing the two bit line signals with the aid of the sense amplifier, it was possible to obtain a quasi analog information item. However, most of the types of stress could not be evaluated quantitatively using this test method, since the information about the stress influence is lost as early as after the first of the many evaluation cycles required, on account of the destructive read operation of an FeRAM.

Analog information obtained in a test of customary DRAMs has a substantially smaller information content in comparison with a stress test to be carried out in the case of an FeRAM.

In the case of the known combination of a ferroelectric memory component with a test circuit—described in U.S. Pat. No. 5,254,482—the latter is integrated as a ferroelectric capacitor at the edge of a chip having ferroelectric memory components, and is connected on the one hand to a line that feeds voltage to the ferroelectric memory cells, and on the other hand to a test pad. In this way, the ferroelectric capacitor serves as a dummy memory cell which supplies analog output signals which can be used for extrapolating the aging and fatigue characteristic values of other ferroelectric components in the ferroelectric memory component. In other words, in the case of the known circuit combination, the test circuit does not acquire the genuine signal values—occurring on the bit lines of the ferroelectric memory component—from the ferroelectric memory cells, but instead the signal values that are read out from the ferroelectric capacitor serving as a dummy cell.

SUMMARY OF THE INVENTION

It is accordingly an object of the invention to provide a circuit configuration which overcomes the above-mentioned disadvantages of the heretofore-known circuit configurations of this general type and which has a cost-effective test circuit for the analog measurement of bit line signals of ferroelectric memory cells with the aid of which the content of ferroelectric memory cells can be read out quantitatively via the potentials on the bit lines and which allows reliable and time-saving evaluation of all stress influences.

With the foregoing and other objects in view there is provided, in accordance with the invention, a circuit configuration, including:

a ferroelectric memory component having a plurality of ferroelectric memory cells, bit lines and sense amplifiers connected to the bit lines;

a test circuit including a plurality of analog amplifiers each connected, on an input side thereof, to an associated one of the bit lines;

the test circuit being integrated in the ferroelectric memory component and having a test mode;

the sense amplifiers being in a state selected from the group consisting of a non-activated state and a disconnected state during the test mode; and the test circuit, when in the test mode, outputting, via the analog amplifiers, analog signals from the ferroelectric memory cells and present on the bit lines connected to the ferroelectric memory cells to a point outside the ferroelectric memory component for an external evaluation of the analog signals.

With the objects of the invention in view there is also provided, a circuit configuration, including:

a ferroelectric memory component having a plurality of ferroelectric memory cells, bit lines and sense amplifiers connected to the bit lines;

a test circuit including an analog amplifier provided for the bit lines, the analog amplifier having an input;

a switching device connected to the input of the analog amplifier and configured to switch analog signals from the bit lines successively to the input of the analog amplifier;

the test circuit being integrated in the ferroelectric memory component and having a test mode;

the sense amplifiers being in a state selected from the group consisting of a non-activated state and a disconnected state during the test mode; and the test circuit, when in the test mode, outputting, via the analog amplifier, analog signals from the ferroelectric memory cells and present on the bit lines connected to the ferroelectric memory cells to a point outside the ferroelectric memory component for an external evaluation of the analog signals.

In other words, the object of the invention is achieved by a combination of a test circuit with a ferroelectric memory component having a plurality of ferroelectric memory cells, bit lines and sense amplifiers connected to the bit lines, the test circuit being integrated in the ferroelectric memory component, wherein the test circuit has either in each case an analog amplifier connected, on the input side, to an associated bit line of the ferroelectric memory module, or, the test circuit has an individual analog amplifier for a plurality of bit lines and a first switching device, in order to connect analog signals from a plurality of bit lines successively to an input of the one analog amplifier, and wherein the test circuit, in a test mode with non-activated or disconnected sense amplifiers of the ferroelectric memory module, outputs the analog signal values occurring on the bit lines from the ferroelectric memory cells connected to the bit lines via the analog amplifier or amplifiers to a point outside the memory module, in order to feed these analog signals to a downstream evaluation device.

Thus, according to the invention, a test circuit having one or more analog amplifiers and, in the case of one analog amplifier, a first switching device is accordingly integrated into the ferroelectric memory component, which test circuit, in a test mode with non-activated or disconnected amplifiers, is set up for the analog outputting of bit line signals from the memory component to the outside. Thus, by way of example, analog signals can be tapped off from one or more test pads of the test circuit and be fed for evaluation to a measuring unit which is connected downstream and is connected to the test pad. The output signal to be tapped off at the test pad should represent an unambiguous function of the bit line signal. By way of example it is possible to use one or more analog amplifiers in order to output measurement signals with high resolution. In one embodiment, it is possible to use a separate analog amplifier for each bit line, or alternatively, for example with the aid of a switching device, one analog amplifier for a plurality of bit lines. In the test mode, the sense amplifiers which are used during normal operation are either not activated or are electrically isolated from the bit lines by switching elements.

According to another feature of the invention, an output of the test circuit or the output or the outputs of the analog amplifier or amplifiers is or are connected to a test pad of the memory module.

According to yet another feature of the invention, a second switching device is provided at the output of the analog test circuit or of the analog amplifier or amplifiers, with which the analog output signal can be switched from this output or these outputs to an output terminal or a test pad of the memory module.

According to another feature of the invention, the test circuit or the analog amplifier or amplifiers is or are set up in such a way that the analog bit line signals to be output can be output with high resolution and without influencing the bit line potentials at the output terminal or test pad.

The test circuit according to the invention can be fabricated at the same time as the circuit of the memory component in a CMOS basic process without additional process steps.

The test circuit proposed according to the invention has, in particular, the following advantages:

lower test complexity, shorter test time, lower data processing complexity, single-cell evaluation possible with little complexity;

complete analog information may be provided, for example including information about retention (in contrast to the previous solution), higher resolution, and direct outputting of information without loss of information for example through fluctuations of the sense amplifiers.

Other features which are considered as characteristic for the invention are set forth in the appended claims.

Although the invention is illustrated and described herein as embodied in a test circuit for the analog measurement of bit line signals of ferroelectric memory cells, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The single FIGURE is a schematic circuit diagram of an exemplary embodiment of a test circuit according to the invention and modifications thereof in combination with a ferroelectric memory component which is only partially illustrated.

DESCRIPTION OF THE PREFERRED EMBODIMENTS

Referring now to the single FIGURE in detail there is shown a test circuit 1, which is framed by a dashed line, and which is connected, on the input side, to bit lines BL0, $\overline{BL0}$, ..., BL1, $\overline{BL1}$, ..., BLn, and $\overline{BLn}$. During normal operation, these bit lines are connected to sense amplifiers LV0, LV1, ..., LVn of the ferroelectric memory configuration. A plurality of memory cells Z are indicated by large filled-in dots at the crossover points of the bit lines with word lines WL0, WL1, WL2, WL3. For quantitative evaluation of the content of the memory cells Z of the ferroelectric memory configuration, the test circuit 1 according to the invention passes an analog value of the memory content to the outside via a test pad P. In this way, it is advantageously possible to carry out a statistical assessment and extrapolation of the change in the memory content through stress, as arises through electrical or mechanical loading, storage, thermal treatment, irradiation or through chemical reactions in the ferroelectric memory component. With the aid of the analog values of the memory content, i.e. potentials of the bit line signals, which are measured by the test circuit 1 according to the invention, it is possible to detect even slight stress-induced changes, as a result of which the influences of the stress on the reliability can be accurately assessed. For this purpose, the test circuit 1 according to the invention provides an analog circuit which is integrated in the ferroelectric memory component and, in the exemplary embodiment illustrated, has in each case an analog amplifier A01, A02, A11, A12, ..., An1 and An2 per connected bit line BL, a first switching device S1 and a second switching device S2. The bit lines BL connected to the test circuit 1 can be connected to the inputs of the respective analog amplifiers via the first switching device S1, and the outputs of the analog amplifiers can be fed to a test pad P via the second switching device S2. The first switching device S1 may have individual transistor switches, for example, while the second switching device S2 may be a decoder, for example. An input of a measuring unit M can be connected to the test pad P.

The measuring unit M outputs a test mode signal TM via a line shown dash-dotted, with which signal, during the test mode, the sense amplifiers LV0, LV1, ..., LVn that are connected to the memory cells Z or bit lines BL during normal operation are deactivated or electrically isolated from the bit lines by further switching elements. The test mode signal TM transmitted by the test unit M also activates a switch controller which controls the switches of the first switching device S1 and of the second switching device S2 in a targeted manner or in a selectable cycle.

The single FIGURE illustrates two main embodiments of the test circuit 1 according to the invention. Either an analog amplifier can be used for each bit line BL, or with the aid of corresponding switching elements, a plurality of bit line signals can be fed to inputs of a common analog amplifier A01, A02, as is indicated by dash-dotted lines 11, 12.

The analog amplifiers used in the test circuit 1 according to the invention and, of course, also the switching elements used for the first and second switching devices S1 and S2 are set up in such a way that the measuring unit M can tap off at the test pad P an unambiguous function of the bit line signals. Consequently, the analog values of the memory content which are present on the bit lines BL0, $\overline{BL0}$, ..., BL1, $\overline{BL1}$, ..., BLn, and $\overline{BLn}$ in each case represent an unambiguous information item—which can be measured by the measuring unit M—for the contents of the cell respectively addressed, so that the measuring unit M can measure even slight changes in the memory content, caused by stress for example, on the basis of the analog signal which can be tapped off at the test pad P.

It is readily apparent to the relevant persons skilled in the art that the exemplary embodiment of the test circuit according to the invention which can be seen in the single FIGURE merely represents a basic circuit diagram, and that known evaluation devices and algorithms for evaluating the stress-induced change in the bit line signals, which reside in the measuring unit M, are not illustrated. Instead of one test pad P, it is also possible to provide a plurality of test pads to which are passed the analog signals from bit lines which are combined in groups by the first and second switching devices and corresponding analog amplifiers.

The analog acquisition of the memory content on the basis of the analog signals fed to the test pad P, which acquisition is proposed according to the invention and made possible by the test circuit 1 described, has in particular the following advantages:
- a lower test complexity, a shorter test time and a lower data processing complexity,
- an evaluation of individual memory cells with little complexity,
- complete analog information assessment of the memory content, for example including changes in the memory content which are brought about by retention,
- a higher resolution, and
- direct acquisition of information without loss of information for example through fluctuations of the sense amplifiers.

We claim:

1. A circuit configuration, comprising:
   a ferroelectric memory component having a plurality of ferroelectric memory cells, bit lines and sense amplifiers connected to said bit lines;
   a test circuit including a plurality of analog amplifiers each connected, on an input side thereof, to an associated one of said bit lines;
   said test circuit being integrated in said ferroelectric memory component and having a test mode;
   said sense amplifiers being in a state selected from the group consisting of a non-activated state and a disconnected state during the test mode; and
   said test circuit, when in the test mode, outputting, via said analog amplifiers, analog signals from said ferroelectric memory cells and present on said bit lines connected to said ferroelectric memory cells to a point outside said ferroelectric memory component for an external evaluation of the analog signals.

2. The circuit configuration according to claim 1, wherein:
   said ferroelectric memory component includes a test pad; and
   said analog amplifiers have respective outputs connected to said test pad.

3. The circuit configuration according to claim 1, wherein:
   said ferroelectric memory component includes a test pad; and
   said test circuit has an output connected to said test pad.

4. The circuit configuration according to claim 1, wherein:
   said ferroelectric memory component includes a test pad;
   said test circuit has an output; and
   a switching device is provided at said output of said test circuit, said switching device switches analog output signals to said test pad.

5. The circuit configuration according to claim 1, wherein:
   said ferroelectric memory component includes a test pad;
   said analog amplifiers have respective outputs; and
   a switching device is provided at said outputs of said analog amplifiers, said switching device switches analog output signals to said test pad.

6. The circuit configuration according to claim 1, wherein:
   said ferroelectric memory component includes an output terminal;
   said test circuit has an output; and
   a switching device is provided at said output of said test circuit, said switching device switches analog output signals to said output terminal of said ferroelectric memory component.

7. The circuit configuration according to claim 1, wherein:
   said ferroelectric memory component includes an output terminal;
   said analog amplifiers have respective outputs; and
   a switching device is provided at said outputs of said analog amplifiers, said switching device switches analog output signals to said output terminal of said ferroelectric memory component.

8. The circuit configuration according claim 1, wherein:
   said ferroelectric memory component includes an output terminal; and
   at least one of said test circuit and said analog amplifiers are configured such that analog bit line signals are output with a given resolution and without influencing bit line potentials at said output terminal.

9. The circuit configuration according claim 1, wherein:
   said ferroelectric memory component includes a test pad; and
   at least one of said test circuit and said analog amplifiers are configured such that analog bit line signals are output with a given resolution and without influencing bit line potentials at said test pad.

10. The circuit configuration according to claim 1, wherein said test circuit and said ferroelectric memory component are configured to be fabricated simultaneously in accordance with a CMOS process.

11. A circuit configuration, comprising:
   a ferroelectric memory component having a plurality of ferroelectric memory cells, bit lines and sense amplifiers connected to said bit lines;
   a test circuit including an analog amplifier provided for said bit lines, said analog amplifier having an input;

a switching device connected to said input of said analog amplifier and configured to switch analog signals from said bit lines successively to said input of said analog amplifier;

said test circuit being integrated in said ferroelectric memory component and having a test mode;

said sense amplifiers being in a state selected from the group consisting of a non-activated state and a disconnected state during the test mode; and said test circuit, when in the test mode, outputting, via said analog amplifier, analog signals from said ferroelectric memory cells and present on said bit lines connected to said ferroelectric memory cells to a point outside said ferroelectric memory component for an external evaluation of the analog signals.

12. The circuit configuration according to claim 11, wherein:

said ferroelectric memory component includes a test pad; and said analog amplifier has an output connected to said test pad.

13. The circuit configuration according to claim 11, wherein:

said ferroelectric memory component includes a test pad; and said test circuit has an output connected to said test pad.

14. The circuit configuration according to claim 11, wherein:

said ferroelectric memory component includes a test pad;

said test circuit has an output; and a further switching device is provided at said output of said test circuit, said further switching device switches analog output signals to said test pad.

15. The circuit configuration according to claim 11, wherein:

said ferroelectric memory component includes a test pad;

said analog amplifier has an output; and a further switching device is provided at said output of said analog amplifier, said further switching device switches analog output signals to said test pad.

16. The circuit configuration according to claim 11, wherein:

said ferroelectric memory component includes an output terminal;

said test circuit has an output; and a further switching device is provided at said output of said test circuit, said further switching device switches analog output signals to said output terminal of said ferroelectric memory component.

17. The circuit configuration according to claim 11, wherein:

said ferroelectric memory component includes an output terminal;

said analog amplifier has an output; and a further switching device is provided at said output of said analog amplifier, said further switching device switches analog output signals to said output terminal of said ferroelectric memory component.

18. The circuit configuration according claim 11, wherein:

said ferroelectric memory component includes an output terminal; and at least one of said test circuit and said analog amplifier are configured such that analog bit line signals are output with a given resolution and without influencing bit line potentials at said output terminal.

19. The circuit configuration according claim 11, wherein:

said ferroelectric memory component includes a test pad; and at least one of said test circuit and said analog amplifier are configured such that analog bit line signals are output with a given resolution and without influencing bit line potentials at said test pad.

20. The circuit configuration according to claim 11, wherein said test circuit and said ferroelectric memory component are configured to be fabricated simultaneously in accordance with a CMOS process.

* * * * *